United States Patent [19]

Sato

[11] 4,233,510
[45] Nov. 11, 1980

[54] SCANNING ELECTRON MICROSCOPE

[75] Inventor: Seisiro Sato, Hitachi, Japan

[73] Assignee: Hitachi, Ltd., Japan

[21] Appl. No.: 966,607

[22] Filed: Dec. 5, 1978

[30] Foreign Application Priority Data

Dec. 5, 1977 [JP] Japan ............................... 52-145040

[51] Int. Cl.$^2$ ........................................... G01M 23/00
[52] U.S. Cl. .................................... 250/311; 250/306
[58] Field of Search ................................ 250/311, 306

[56] References Cited
U.S. PATENT DOCUMENTS 4,039,829  8/1977  Kato et al. ............................ 250/310

Primary Examiner—Harold A. Dixon
Attorney, Agent, or Firm—Craig & Antonelli

[57] ABSTRACT

Two marks of variable positions are displayed in superposition on the image of a specimen. The distance between two points on the specimen corresponding respectively to the marks is calculated on the basis of the magnification of the image of the specimen. The distance thus calculated is multiplied by a predetermined coefficient.

10 Claims, 3 Drawing Figures

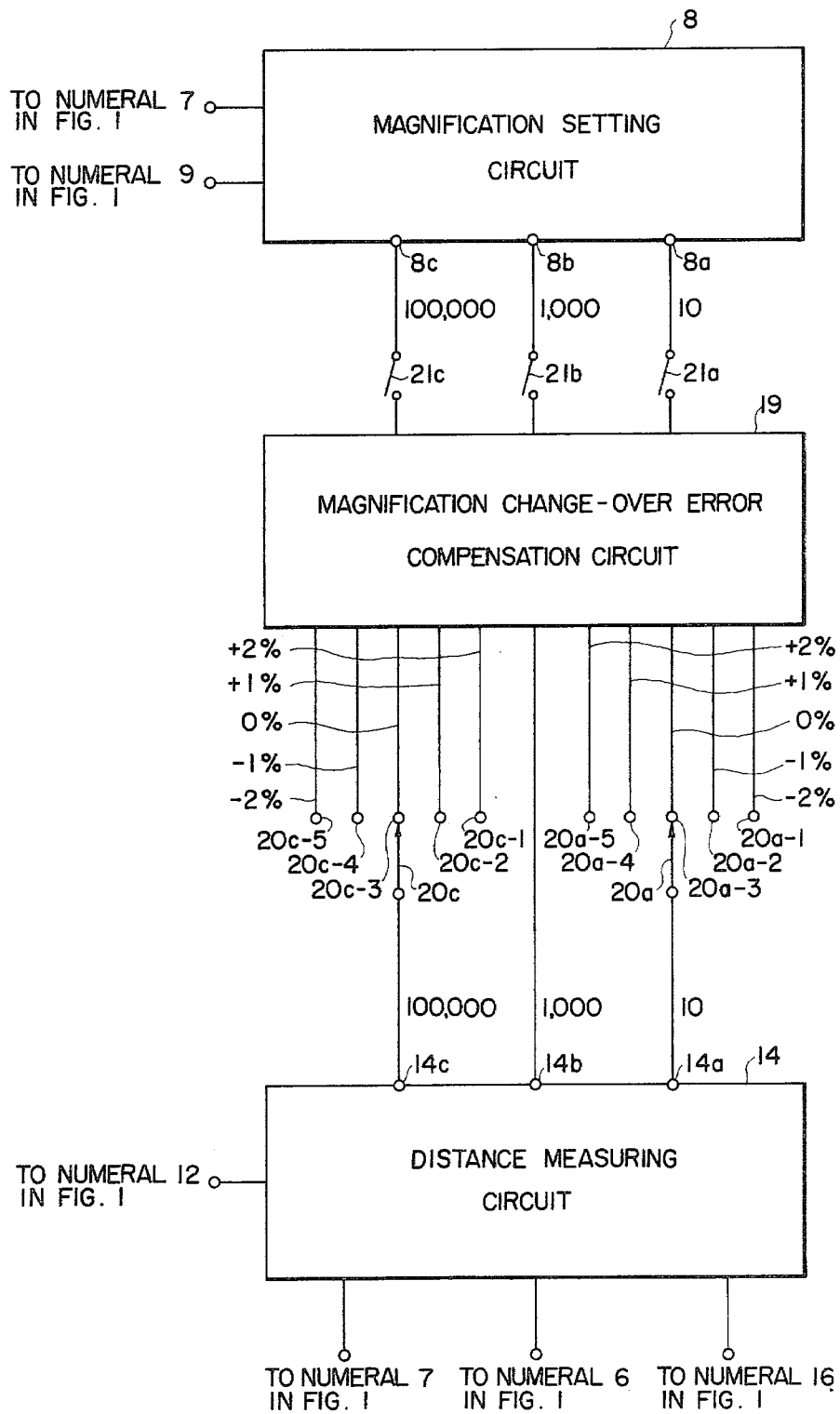

SCANNING ELECTRON MICROSCOPE

BACKGROUND OF THE INVENTION

1. Field of the Invention

This invention relates to a scanning electron microscope, and more particularly to a scanning electron microscope suitable for measuring the distance between a first point on a specimen and a second point different therefrom.

2. Description of the Prior Art

As is well known, in the scanning electron microscope, a specimen is scanned in two dimensions by an electron beam, and an information signal characteristic of the specimen as thus obtained therefrom (such as secondary electron signal, reflected electron signal, absorbed electron signal, Auger electron signal, cathode luminescence signal and X-ray signal) is introduced into a cathode-ray tube as a brilliance modulation signal. On the other hand, the screen of the cathode-ray tube is scanned in two dimensions in synchronism with the scanning of the specimen by an electron beam which is generated in the cathode-ray tube. Accordingly, the image of the scanned area of the specimen based on the information signal peculiar to the specimen is displayed on the screen of the cathode-ray tube.

In such a scanning electron microscope, it has recently been regarded as especially important to precisely measure the true distance between two points on the specimen as corresponds to any desired two points on the specimen image displayed on the cathode-ray tube. Techniques which meet this requirement are stated in U.S. Pat. No. 4,039,829 entitled "Stereoscopic Measuring Apparatus" and issued to the same assignee as that of the present application on Aug. 2, 1977 and in the copending application entitled "Scanning Type Electron Microscope," Ser. No. 934,716, filed Aug. 21, 1978. According to these techniques, especially the latter, the distance between any desired two points on the specimen can be accurately measured insofar as the magnification of the specimen image and the inclination angle of the specimen to the electron beam are precisely set. In the strict sense, however, the magnification or the inclination angle is not always set precisely. Even if it has been precisely set once, ordinarily the set value will change with time. It is accordingly inevitable in practice that the actual measurement value of the distance does not represent the true value in the strict sense but that it includes an error.

According to U.S. Pat. No. 3,321,575 entitled "Television Inspection Apparatus Adapted for Measurement and Comparison Purposes" and issued May 23, 1967, the images of an object of known dimensions and an object of unknown dimensions are taken with a video camera and indicated on display means. Straight traces whose positions are variable are respectively superposed on both the object images indicated, an electric signal which represents the difference of the lengths of both the images along the traces is generated, and a value which is proportional thereto is indicated on an indicator. This technique measures the size of the object of unknown dimensions by directly comparing it with the size of the object of known dimensions. Therefore, when it is applied to the scanning electron microscope, the distance between two points on a specimen can be accurately measured without accompanying the problem of the setting errors of the magnification and the inclination angle of the specimen as previously described.

With such a technique, however, the object of known dimensions or a reference specimen and the object of unknown dimensions or an unknown specimen need to have nearly equal dimensions (lengths). The reason is that, in case where the unknown specimen is much larger than the reference specimen, the dimension (length) measuring precision of the reference specimen lowers, or the measurement becoming difficult. In the converse case, a similar problem occurs as to the unknown specimen. This signifies that, when the sizes of unknown specimens having greatly different dimensions from one another need to be measured, a large number of reference specimens respectively having dimensions approximately equal to those of the unknown specimens must be prepared.

SUMMARY OF THE INVENTION

An object of this invention is to provide a scanning electron microscope which can accurately measure the distance between a first point on a specimen and a second point different therefrom without the influence of the setting errors of a magnification and an inclination angle of the specimen.

Another object of this invention is to provide a scanning electron microscope which can accurately measure the distance between a first point and a second point on a specimen without preparing many reference specimens even in case where the value of the distance varies widely and which can accurately measure the distance without the influence of the setting errors of a magnification and an inclination angle of the specimen.

According to this invention, a specimen is scanned by an electron beam so that an information signal characteristic of the specimen may be obtained from the specimen. The image of the specimen is indicated on display means on the basis of the information signal. First and second marks of variable positions are also indicated on the display means in a manner to be superposed on the image. The distance between first and second points on the specimen corresponding respectively to the first and second marks is calculated on the basis of the positions of the first and second marks and the magnification of the image, and the calculated value is further multiplied by a predetermined constant.

The above-mentioned and other objects and features of this invention will become apparent from the following description taken with reference to the drawings.

BRIEF DESCRIPTION OF THE DRAWINGS

FIG. 2 is a block diagram showing an embodiment of a compensation circuit in FIG. 1.

DESCRIPTION OF THE PREFERRED EMBODIMENTS

Figure 1:
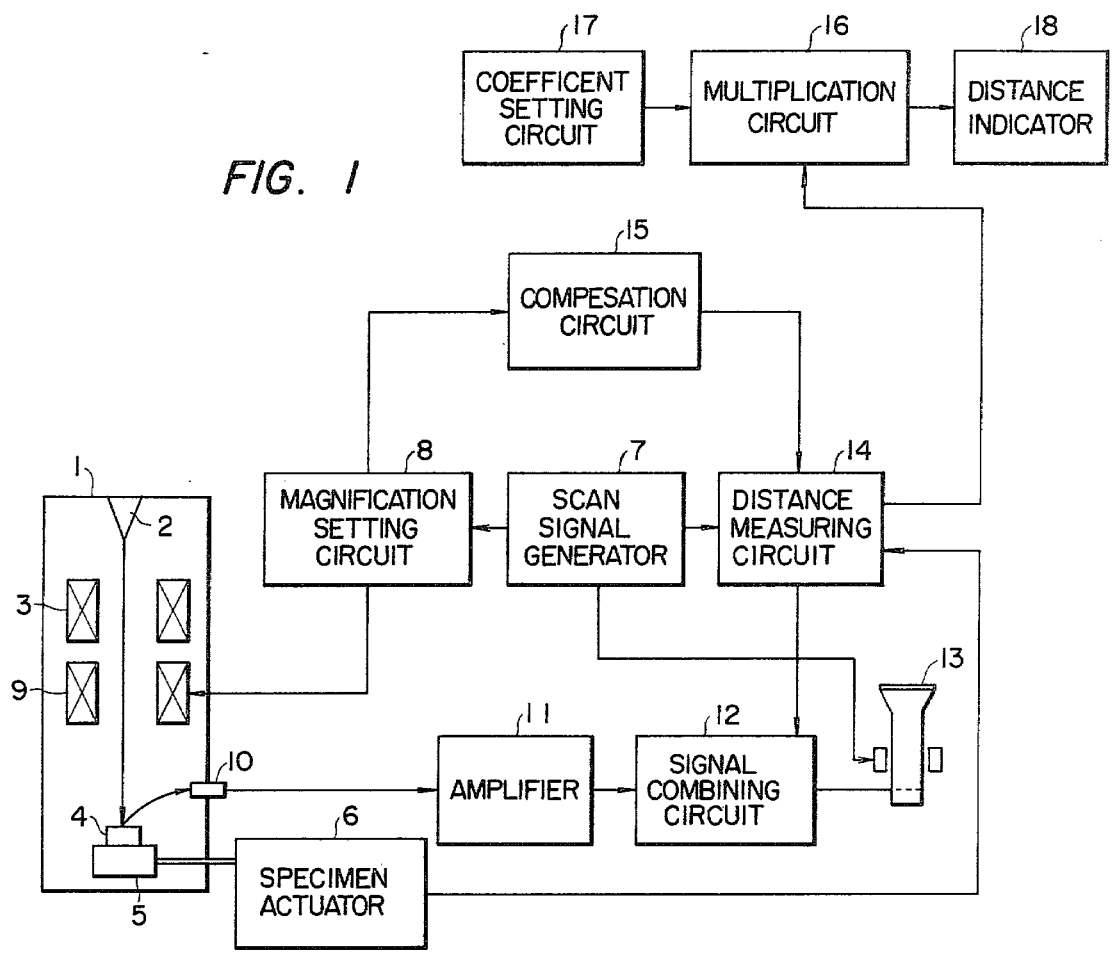
FIG. 1 is a block diagram of a scanning electron microscope showing an embodiment of this invention.

Referring to FIG. 1, an electron gun 2 is arranged in a column 1 of a scanning electron microscope held in a vacuum, and an electron beam emitted from the electron gun 2 is converged on a specimen 4 by a focusing lens 3. The specimen 4 is attached to a specimen stand 5. A specimen actuator 6 is so constructed that the specimen stand 5, accordingly the specimen 4 can be inclined relative to the electron beam any desired angle and brought to a standstill at the angular position by an operation outside the column 1, and that the specimen 4 can be moved horizontally. The specimen actuator 6 includes means for detecting the inclination angle of the specimen and generating the corresponding electric signal.

A scan signal generator 7 generates x-axis and y-axis scan signals respectively composed of saw-tooth waves. These signals are applied to a deflector 9 through a magnification setting circuit 8. The electron beam is thus deflected in two dimensions, with the result that the specimen 4 is scanned in two dimensions by the converged electron beam. When the specimen 4 is irradiated by the converged electron beam, information signals characteristic of the specimen 4 such as secondary electron signal, reflected electron signal, absorbed electron signal, Auger electron signal, X-ray signal and cathode luminescence signal can be derived from the specimen. Of course, in case where the specimen 4 is thin, a transmitted electron signal can also be derived. In FIG. 1, the secondary electron signal among these information signals is detected by a detector 10. The detected signal is introduced into the grid of a cathode-ray tube 13 through an amplifier 11 and a signal combining circuit 12 as a brilliance modulation.

The x-axis and y-axis scan signals generated by the scan signal generator 7 are also applied to the deflector of the cathode-ray tube 13. Thus, the screen of the cathode-ray tube 13 is scanned in two dimensions in synchronism with the two-dimensional scanning of the specimen 4. Accordingly, that image of an area of the specimen 4 subjected to the two-dimensional scanning by the electron beam which is based on the secondary electron signal is displayed on the screen.

The magnification setting circuit 8 includes means for varying the amplitudes of the x-axis and y-axis scan signals which are applied from the scan signal generator 7 to the deflector 9. To change the amplitudes signifies to change the size of the scan area of the specimen 4. In turn, to change the size of the scan area signifies to change the magnification of the image which is displayed on the cathode-ray tube 13. The magnification setting circuit 8 also includes means for generating an electric signal representative of the magnification thus varied.

A distance measuring circuit 14 includes means for generating variable position signals, and means for calculating the distance between any desired two points on the specimen 4 on the basis of the position signals, the electric signal representative of the set inclination angle of the specimen sent from the specimen actuator 6, and the electric signal representative of the set magnification sent from the magnification setting circuit 8 through a compensation circuit 15. The distance measuring circuit 14 generates two of the variable position signals, which are added to the signal from the amplifier 11 in the signal combining circuit 12. The resultant signals are introduced into the cathode-ray tube 13 as brilliance modulation signals. In consequence, two marks formed by the two variable position signals are indicated in superposition on the image displayed on the cathode-ray tube 13. Of course, the positions of these marks can be arbitrarily changed by varying the two positional signals.

On the other hand, in the distance measuring circuit 14, the distance between the two points on the specimen 4 corresponding to the two marks on the cathode-ray tube 13 is calculated on the basis of the two positional signals, the electric signal representative of the set inclination angle of the specimen sent from the specimen actuator 6, and the electric signal representative of the set magnification sent from the magnification setting circuit 8 through the compensation circuit 15.

The details of the contents thus far described are stated in the copending application, Ser. No. 934,716 with the exception of the compensation circuit 15.

As previously described, the magnification is not always set precisely in the strict sense. If the setting is not precise, the electric signal representative of the magnification applied to the distance measuring circuit 14 does not represent an actually set magnification. In the distance measuring circuit 14, therefore, the calculation for evaluating the distance between the two points on the specimen is done on the basis of the erroneous magnification differing from the actually set magnification. The calculated value as the result does not offer the true distance value between the two points on the specimen and includes an error. This concept applies quite similarly in case where the inclination angle of the specimen is not set precisely.

This invention can solve such a problem, and its fundamental idea will now be explained.

Let it be supposed that the distance between the first and second points on the image of an unknown specimen as actually displayed on the cathode-ray tube 13 is Lu. It is further assumed that notwithstanding a magnification and an inclination angle of the specimen actually set are M and $\theta$ respectively, a magnification and an inclination angle of the specimen given to the distance measuring circuit 14 are $M+\Delta M$ and $\theta+\Delta\theta$ respectively. Then, the following two equations are obtained:

$$lu = Lu/M \cos \theta \tag{1}$$

$$lu' = Lu/\{(M+\Delta M) \cos (\theta+\Delta\theta)\} \tag{2}$$

where the specimen inclination angle $\theta$ denotes the angle by which the unknown specimen is leaned with respect to a plane orthogonal to the axis of the electron beam. lu in Equation (1) represents the true distance between the first and second points on the unknown specimen corresponding respectively to the first and second points on the cathode-ray tube 13. lu' in Equation (2) represents the distance actually calculated in the distance measuring circuit 14, between the first and second points on the unknown specimen corresponding respectively to the first and second points on the cathode-ray tube 13. The actually calculated distance lu', however, is a value miscalculated on the assumption that the magnification and the specimen inclination angle are $M+\Delta M$ and $\theta+\Delta\theta$ respectively, although the quantities actually set are M and $\theta$ respectively. It is accordingly understood that lu' is a value including an error. To be obtained is lu in Equation (1), which is found in such a way that the value lu' actually calculated in the distance measuring circuit 14 is multiplied by a certain constant k as follows:

$$lu = Lu/M \cos \theta = kLu/\{(M+\Delta M) \cos (\theta+\Delta\theta)\} \tag{3}$$

From this equation, k becomes:

$$k = (M+\Delta M) \cos (\theta+\Delta\theta)/M \cos \theta \tag{4}$$

On the other hand, it is supposed that when the image of a reference specimen is displayed on the cathode-ray tube 13 instead of the image of the unknown specimen, the distance between the first and second points on the former image is Lk. It is further assumed that notwithstanding a magnification and a specimen inclination angle actually set are M and $\theta$ respectively, a magnification and a specimen inclination angle given to the distance measuring circuit 14 are $M+\Delta M$ and $\theta+\Delta\theta$ respectively. Then, likewise to the case of the unknown specimen, the following two equations can be obtained:

$$lk = Lk/M \cos \theta \qquad (5)$$

$$lk' = Lk/\{(M+\Delta M) \cos (\theta + \Delta\theta)\} \qquad (6)$$

When Equation (6) is divided by Equation (5), there is obtained an equation $lk/lk' = (M+\Delta M) \cos (\theta+\Delta\theta)/\{M \cos \theta\}$. This agrees with the value of k in Equation (4). Accordingly, Equation (4) can be rewritten as follows:

$$k = lk/lk' \qquad (7)$$

Here, lk is assumed to be known. Then, the true distance lu between the first and second points on the unknown specimen can be accurately evaluated in such a way that the value lu' actually calculated in the distance measuring circuit 14 as to the unknown specimen is multiplied by k representative of the ratio between the known true distance lk between the first and second points on the known specimen and the value lk' actually calculated in the distance measuring circuit 14 as to the known specimen.

There will now be explained how the true distance lu between the first and second points on the unknown specimen is obtained by the embodiment of FIG. 1. In order to facilitate understanding of the explanation, the specimen 4 is supposed to be the unknown specimen. The unknown specimen, and the reference specimen (not shown) are attached to the specimen stand 5. In this case, it is supposed that the inclination angles of these specimens are adjusted in advance so that, when the specimens are moved by the specimen actuator 6 to positions in which they are selectively irradiated by the electron beam, both the specimens may be leaned by $\theta$ with respect to a plane orthogonal to the electron beam.

First, the specimens are moved by the specimen actuator 6 to positions in which the reference specimen is irradiated by the electron beam. Under this state, the reference specimen is scanned in two dimensions by the electron beam so that the image of the reference specimen may be displayed on the cathode-ray tube 13. Here it is considered that the magnification and the specimen inclination angle actually set by the magnification setting circuit 8 and the specimen actuator 6 are M and $\theta$ respectively, whereas on account of setting errors the magnification and the specimen inclination angle which are represented by the electric signals applied from the magnification setting circuit 8 and the specimen actuator 6 to the distance measuring circuit 14 are $M+\Delta M$ and $\theta+\Delta\theta$ respectively. The two marks are indicated in superposition on the image of the reference specimen, and are respectively brought into agreement with the first and second points on the cathode-ray tube 13 corresponding to the first and second points on the reference specimen spaced by the known value lk from each other. The distance measuring circuit 14 calculates and evaluates the value lk' of Equation (6) on the basis of the positional signals of the two marks, the magnification $M+\Delta M$ and the specimen inclination angle $\theta+\Delta\theta$. The calculated value lk' is led to a multiplication circuit 16. The multiplication circuit 16 multiplies the output value lk' from the distance measuring circuit 14 and a coefficient from a coefficient setting circuit 17. Regarding the reference specimen, however, the coefficient which is the output from the coefficient setting circuit 17 is the value "1". Accordingly, the value lk' led to the multiplication circuit 16 is indicated on a distance indicator 18 as it is. lk is the known value as stated before, and lk' is the value indicated on the distance indicator 18, so that the value of k in Equation (7) is found from these values.

Subsequently, the specimens are moved by the specimen actuator 6 to positions in which the unknown specimen is irradiated by the electron beam. Under this state, the unknown specimen is scanned in two dimensions by the electron beam so as to display its image on the cathode-ray tube 13. At this time, the conditions of the specimen inclination angle, the magnification etc. are supposed to be the same as those in the distance measurement on the reference specimen. The two marks are displayed in superposition on the image of the unknown specimen, and are respectively brought into agreement with the first and second points on the unknown specimen spaced by lu from each other. The distance measuring circuit 14 calculates and evaluates lu' of Equation (2) on the basis of the signals representative of the positions of the two marks, the magnification $M+\Delta M$ and the specimen inclination angle $\theta+\Delta\theta$. The value lu' is led to the multiplication circuit 16. The coefficient setting circuit 17 sets its output at the value of k of Equation (7) obtained on the reference specimen. The multiplication circuit 16 accordingly executes an operation of lu'×k, and the result is indicated on the distance indicator 18.

From the explanation thus far made, it is understood that the error of distance measurement attributed to the disagreement between the magnification as well as the specimen inclination angle actually set and the magnification as well as the specimen inclination angle actually applied to the distance measuring circuit 14 can be readily and exactly compensated for.

In order to facilitate understanding of the explanation, it is supposed by way of example that a magnification value which permits the distance lk between the first and second points on the reference specimen to be measured at high precision is 1,000. Then, when the distance lu between the first and second points on the unknown specimen is e.g. 100 times greater than the distance lk, the measurement of lu is practically impossible at the magnification of 1,000. This is because the distance lu overflows the screen of the cathode-ray tube 13 at the magnification value of 1,000. In such a case, the magnification value is changed-over to and set at e.g. 10 only when the distance lu is measured. Thus, lu is displayed on the cathode-ray tube 13 in the same size as that of lk, and it can therefore be measured at high precision. Conversely, when lu is e.g. 100 times smaller than lk, the magnification value is changed-over to and set at e.g. 100,000 only in case of measuring lu. Then, lu is displayed on the cathode-ray tube 13 in the same size as that of lk and can therefore be measured at high precision. That is, when lu differs from lk by one or more places, the magnification value at the measurement of lu is changed-over to and set at a value different from the magnification value at the measurement of lk, whereby lu can be measured at high accuracy. This signifies that even in case where lu is different from lk by one or more places, it is unnecessary to prepare many reference specimens according to the values of lu's, in other words, lu's of various values can be measured at high precision by the use of only one reference specimen.

When, in measuring the distance lu, the magnification value is changed-over from the value 1,000 at the measurement of lk to the value 10 or 100,000, it is not always set at the value 10 or 100,000 exactly. Assuming for example that when the magnification value is changed-over to 10 the actually set magnification value is 10.1, then the error percentage of magnification change-over becomes 0.1/10=1%. This signifies that in spite of the actually set magnification value being 10.1 the magnification value actually given to the distance measuring circuit 14 is the value 10, so the circuit 14 calculates lu upon regarding the actually set magnification value as 10, resulting in the inclusion of an error in the actually calculated lu. Likewise, assuming by way of example that when the magnification value is changed-over to 100,000 the actually set magnification value is 101,000, then the error percentage of magnification change-over becomes 1,000/100,000=1%. Also in this case, accordingly, the actually calculated lu includes an error attendant upon the error of magnification change-over.

The compensation circuit 15 in FIG. 1 serves to compensate for the error of lu which develops in the presence of the error of magnification change-over and in consequence thereupon. The details of this circuit will now be described with reference to FIG. 2. In the figure, the same parts as in FIG. 1 are assigned the same symbols. The magnification setting circuit 8 has magnification output terminals 8a, 8b and 8c, which are connected to a magnification change-over error compensation circuit 19 through switches 21a, 21b and 21c respectively. The magnification output terminal 8a is for a magnification value 10, 8b for a magnification value 1,000 and 8c for a magnification value 100,000. The distance measuring circuit 14 has magnification input terminals 14a, 14b and 14c, which are for the magnification values 10, 1,000 and 100,000 respectively. The magnification input terminals 14a and 14c are respectively connected to the magnification change-over error correction circuit 19 through switches 20a and 20c, and the magnification input terminal 14b is directly connected to the magnification change-over error composition circuit 19. The switches 20a and 20c have change-over contacts 20a-1, 20c-1; 20a-2, 20c-2; 20a-3, 20c-3; 20a-4, 20c-4; and 20a-5, 20c-5; respectively. The magnification change-over error compensation circuit 19 has the function of supplying the magnification signal from the magnification output terminal 8a through the switches 21a and 20a to the magnification input terminal 14a, the magnification signal from the magnification output terminal 8b through the switch 21b to the magnification input terminal 14b, and the magnification signal from the magnification output terminal 8c through the switches 21c and 20c to the magnification input terminal 14c. Besides, the magnification change-over error compensation circuit 19 has the function of delivering values equal to 102%, 101%, 100%, 99% and 98% of the magnification value 10 to the respective change-over contacts 20a-1, 20a-2, 20a-3, 20a-4 and 20a-5 of the switch 20a and the function of delivering values equal to 102%, 101%, 100%, 99% and 98% of the magnification value 100,000 to the respective change-over contacts 20c-1, 20c-2, 20c-3, 20c-4 and 20c-5 of the switch 20c.

In FIG. 2, numerical values 100,000; 1,000 and 10 denote the magnification values respectively, and percent values +2%, +1%, 0%, −1% and −2% denote the magnification change-over errors respectively.

Now, upon closure of the switch 21b, the magnification value of 1,000 is given to the input terminal 14b. lk is measured at this magnification value. Thereafter, since lu is e.g. 100 times greater than lk the magnification value 10 is given to the input terminal 14a by opening the switch 21b and closing the switch 21a, and lu is measured at this magnification value. In this case, the magnification actually set by the magnification setting circuit 8 is assumed to be 10.1 . Then, the magnification change-over error becomes +1%. The magnification value 10 appearing at the magnification output terminal 8a is applied as it is to the magnification input terminal 14a under the state under which the switch 20a is thrown onto the change-over contact 20a-3. As a result, the distance measuring circuit 14 calculates lu upon regarding the actually changed-over and set magnification value as 10, so that the calculated lu includes an error. In this case, accordingly, the magnification value 10 appearing at the magnification output terminal 8a must be controlled into 10.1. This is accomplished by throwing the switch 20a onto the change-over contact 20a-2. Thus, the magnification input terminal 14a is given the magnification value 10.1 [=10(1+0.01)], with the result that the value of the magnification actually set and the value of the magnification actually applied to the distance measuring circuit 14 come into agreement. Therefore, the actually calculated lu indicates the true value free from the influence of the magnification change-over error. Needless to say, when the magnification change-over error is +2%, 0%, −1% or −2%, the magnification value actually set and the magnification value actually applied to the distance measuring circuit 14 are brought into agreement by throwing the switch 20a onto 20a-1, 20a-3, 20a-4 or 20a-5 respectively.

Although FIG. 2 illustrates the example in which the number of the change-over contacts of the switch 20 is five, this number can be increased or decreased as is needed in practice. Also in case of measuring lu by changing-over the magnification value to and setting it at 100,000, the situation is quite the same as in the case of measuring lu by changing-over the magnification value to and setting it at 10, and hence, the explanation of the former case is omitted in order to avoid tediousness. Although, in FIG. 2, the example of basically changing-over the magnification in three stages is illustrated, this is merely for the purpose of facilitating the understanding of the explanation, and the number of stages of the magnification may be increased or decreased as desired in practice.

Advantages which are brought forth by the embodiment described above are summed up below.

(1) Even when setting errors of the magnification and the specimen inclination angle exist, the true distance lu between the first point and the second point on the unknown specimen can be precisely evaluated by multiplying the actually calculated value lu by the constant k.

(2) Even in case where lu is extremely large or small relative to lk, lu can be precisely evaluated by measuring it at a magnification value changed-over from the magnification value at the measurement of lk, insofar as the magnification change-over includes no error. In case where the magnification change-over includes an error, lu can be precisely evaluated by compensating for the error.

Figure 3:
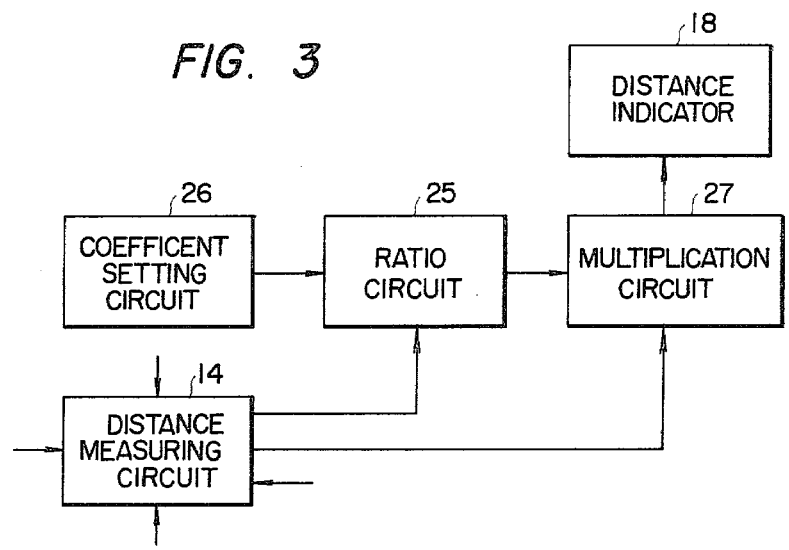
FIG. 3 is a block diagram showing a modification of a portion in FIG. 1 for compensating for the setting errors of a magnification and a specimen inclination.

FIG. 3 shows a modified embodiment of the portion in FIG. 1 for compensating for the setting errors of the magnification and the specimen inclination angle. lk' on the reference specimen calculated by the distance measuring circuit 14 is applied to a ratio circuit 25. Also the known value lk of the reference specimen is applied to the ratio circuit 25 from a coefficient setting circuit 26. In the ratio circuit 25, the division of lk/lk'=k is thus executed. The output lk/lk'=k of the ratio circuit 25 is applied to a multiplication circuit 27, to which lu' on the unknown specimen calculated by the distance measuring circuit 14 is also applied. The multiplication of lu'×k is executed in the multiplication circuit 27, and the result is indicated on the distance indicator 18. With the embodiment of FIG. 3, quite the same results as in the embodiment of FIG. 1 can be achieved.

While the preferred embodiments of this invention have been described with reference to the drawings, a large number of modifications or alterations can be made without departing from the essentials of this invention, and it is therefore to be understood that the invention is restricted by only the appended claims.

We claim:

1. A scanning electron microscope comprising means for generating an electron beam; means for scanning a specimen with the electron beam so as to obtain an information signal characteristic of the specimen from said specimen; means for displaying an image of the specimen on the basis of the information signal; means for setting a magnification of the image; means for indicating first and second marks of variable positions on the display means in a manner to be superposed on the image; and means for calculating a distance between first and second points on the specimen corresponding respectively to the first and second marks on the basis of the magnification and positions of said first and second marks, the calculation means including means for multiplying the calculated value of the distance between the first and second points by a predetermined constant so as to compensate for a possible error in the magnification setting.

2. A scanning electron microscope comprising means for generating an electron beam; means for scanning a specimen with the electron beam so as to obtain an information signal characteristic of the specimen from said specimen; means for displaying an image of the specimen on the basis of the information signal; means for setting a magnification of the image; means for setting an inclination angle of the specimen with respect to the electron beam; means for indicating first and second marks of variable positions on the display means in a manner to be superposed on the image; and means for calculating a distance between first and second points on the specimen corresponding respectively to the first and second marks on the basis of the magnification, the inclination angle and positions of said first and second marks, the calculation means including means for multiplying the calculated value of the distance between the first and second points by a predetermined constant so as to compensate for a possible error in the magnification setting.

3. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a magnification of the image of the reference specimen and the image of the unknown specimen; means for indicating first and second marks of variable positions on the display means in a manner to be selectively superposed on the image of the reference specimen and the image of the unknown specimen; and means for selectively calculating a distance between first and second positions on the reference specimen corresponding respectively to the first and second marks and a distance between first and second positions on the unknown specimen corresponding respectively thereto on the basis of the magnification and positions of said first and second marks, the calculation means including means for multiplying the calculated value of the distance between the first and second points on the unknown specimen by a predetermined constant, the constant being proportional to a ratio between the distance between the first and second points on the reference specimen as is known and said distance between the first and second points on the reference specimen as calculated by said calculation means.

4. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a magnification of the image of the reference specimen and the image of the unknown specimen; means for setting an inclination angle of the reference specimen and the unknown specimen with respect to the electron beam; means for indicating first and second marks of variable positions on the display means in a manner to be selectively superposed on the image of the reference specimen and the image of the unknown specimen; and means for calculating a distance between first and second points on the reference specimen corresponding respectively to the first and second marks and a distance between first and second points on the unknown speciment corresponding respectively thereto on the basis of the magnification, the inclination angle and positions of said first and second marks, the calculation means including means for multiplying the calculated value of the distance between the first and second points on the unknown specimen by a predetermined constant, the constant being proportional to a ratio between the distance between the first and second points on the reference specimen as is known and said distance between the first and second points on the reference specimen as calculated by said calculation means.

5. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a variable magnification of the images of the reference specimen and the unknown specimen, the magnification being set at a first value when the image of the reference specimen is displayed and being set at a second value when the image of the unknown specimen is displayed; means for indicating first and second marks of variable positions on the display means in a manner to be selectively superposed on the image of the reference specimen and the image of the unknown specimen; and means for selectively calculating a distance between first and second points on the reference specimen corresponding respectively to the first and second marks as based on the magnification of the first value and positions of said first and second marks and a distance between first and second points on the unknown specimen corresponding respectively to the first and second marks as based on the magnification of the second value and the positions of the first and second marks, the calculation means including means for multiplying the calculated value of the distance between the first and second points on the unknown specimen by a predetermined constant, the constant being proportional to a ratio between the distance between the first and second points on the reference specimen as is known and said distance between the first and second points on the reference specimen as calculated by said calculation means.

6. A scanning electron microscope according to claim 5, comprising means for regulating the magnification of the second value.

7. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a variable magnification of the images of the reference specimen and the unknown specimen, the magnification being set at a first value when the image of the reference specimen is displayed and being set at a second value when the image of the unknown specimen is displayed; means for setting an inclination angle of the reference specimen and the unknown specimen with respect to the electron beam; means for indicating first and second marks of variable positions on the display means in a manner to be selectively superposed on the image of the reference specimen and the image of the unknown specimen; and means for selectively calculating a distance between first and second points on the reference specimen corresponding respectively to the first and second marks as based on the magnification of the first value, the inclination angle and positions of said first and second marks and a distance between first and second points on the unknown specimen corresponding respectively to the first and second marks as based on the magnification of the second value, the inclination angle and the positions of said first and second marks, the calculation means including means for multiplying the calculated view of the distance between the first and second points on the unknown specimen by a predetermined constant, the constant being proportional to a ratio between the distance between the first and second points on the reference specimen as is known and said distance between the first and second points on the reference specimen as calculated by said calculation means.

8. A scanning electron microscope according to claim 7, comprising means for regulating the magnification of the second value.

9. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a variable magnification of the images of the reference specimen and the unknown specimen, the magnification being set at a first value when the image of the reference specimen is displayed and being set at a second value when the image of the unknown specimen is displayed; means for setting an inclination angle of the reference specimen and the unknown specimen with respect to the electron beam; means for indicating first and second marks of variable positions on the display means in a manner to be selectively superposed on the image of the reference specimen and the image of the unknown specimen; means for selectively calculating a distance between first and second points on the reference specimen corresponding respectively to the first and second marks as based on the magnification of the first value, the inclination angle and positions of said first and second marks and a distance between first and second points on the unknown specimen corresponding respectively to the first and second marks as based on the magnification of the second value, the inclination angle and the positions of said first and second marks; and means for regulating the magnification of the second value; the calculation means including means for setting a constant representative of a ratio between a distance between first and second points on the reference specimen as is known and said distance between the first and second points on the reference specimen as calculated by said calculation means, and means for calculating a product between the constant and a value of a distance between first and second points on the unknown specimen corresponding respectively to the first and second marks as calculated by said calculation means.

10. A scanning electron microscope comprising means for generating an electron beam; means for selectively scanning a reference specimen and an unknown specimen with the electron beam so as to selectively obtain an information signal characteristic of the reference specimen and an information signal characteristic of the unknown specimen; means for selectively displaying an image of the reference specimen and an image of the unknown specimen on the basis of the information signal of said reference specimen and the information signal of said unknown specimen respectively; means for setting a variable magnification of the images of the reference specimen and the unknown specimen, the magnification being set at a first value when the image of the reference specimen is displayed and being set at a second value when the image of the unknown specimen is displayed; means for setting an inclination angle of the reference specimen and the unknown specimen with respect to the electron beam; means for indicating first and second marks of variable positions on the display means in a manner to be selectively superposed on the image of the reference specimen and the image of the unknown specimen; means for selectively calculating a distance between first and second points on the reference specimen corresponding respectively to the first and second marks as based on the magnification of the first value, the inclination angle and positions of said first and second marks and a distance between first and second points on the unknown specimen corresponding respectively to the first and second marks as based on the magnification of the second value, the inclination angle and the positions of said first and second marks; and means for regulating the magnification of the second value; the calculation means including means for setting a distance between first and second points on the reference specimen as is known, means for computing a ratio between said distance and the distance between the first and second points on the reference specimen as calculated by said calculation means, and means for evaluating a product between the value of the ratio and a distance between first and second points on the unknown specimen as calculated by said calculation means.

* * * * *